United States Patent [19]
Ferrant

[11] Patent Number: 6,005,818
[45] Date of Patent: Dec. 21, 1999

[54] DYNAMIC RANDOM ACCESS MEMORY DEVICE WITH A LATCHING MECHANISM THAT PERMITS HIDDEN REFRESH OPERATIONS

[75] Inventor: Richard J. Ferrant, Richmond, Calif.

[73] Assignee: STMicroelectronics, Inc., Carrolton, Tex.

[21] Appl. No.: 09/009,343

[22] Filed: Jan. 20, 1998

[51] Int. Cl.[6] .................................................. G11C 7/00
[52] U.S. Cl. .................. 365/222; 365/230.03; 365/149; 365/189.02
[58] Field of Search .............................. 365/222, 230.03, 365/149, 189.02, 230.02, 205

[56] References Cited

U.S. PATENT DOCUMENTS

| | | | |
|---|---|---|---|
| 4,185,323 | 1/1980 | Johnson et al. | 365/222 |
| 5,146,430 | 9/1992 | Torimaru et al. | 365/222 |
| 5,253,211 | 10/1993 | Suzuki | 365/222 |
| 5,367,493 | 11/1994 | Yamagata | 365/222 |
| 5,835,401 | 11/1998 | Green et al. | 365/149 |

*Primary Examiner*—Huan Hoang
*Attorney, Agent, or Firm*—Theodore E. Galanthay; Lisa K. Jorgenson; Peter J. Thoma

[57] ABSTRACT

A dynamic access memory (DRAM) device includes a plurality of memory cells for storing data signals. The DRAM device has a row decoding mechanism that allows selected memory cells to be accessed upon receipt of a row address signal during a read operation and a write operation. A latching mechanism is provided and receives and holds onto the data signals from the selected memory cells when activated during the read operation and also isolates itself from the selected memory cells when deactivated during the write operation. An included refresh address generating mechanism generates a plurality of internal row address signals that allows selection of a plurality of memory cells for refreshing the stored data signals. The DRAM device also has a multiplexer mechanism that transmits a plurality of external row address signals to the row decoding mechanism in the write operation. The multiplexer mechanism also transmits internal row address signals from the refresh address generating mechanism during the read operation, thereby causing the row decoding mechanism to apply the internal row address signals to select memory cells and allow their stored data signals to be refreshed. Therefore, DRAM refresh operations can be performed concurrently during read operations.

20 Claims, 6 Drawing Sheets

DYNAMIC RANDOM ACCESS MEMORY DEVICE WITH A LATCHING MECHANISM THAT PERMITS HIDDEN REFRESH OPERATIONS

FIELD OF THE INVENTION

The present invention relates generally to dynamic random access memory (DRAM), and more particularly to a DRAM device incorporating an embedded or on-board self-refresh mechanism for performing memory refresh operations when the device is being read. The present invention allows for memory refresh operations to take place during normal read accesses, thereby optimizing the availability of the DRAM device for supporting computing applications. Furthermore, the present invention allows for a decrease in DRAM package size, consequently permitting further miniaturization of portable computing devices into which it is employed.

DESCRIPTION OF THE PRIOR ART

There has been a remarkable increase in demand for portable computing devices for a broad range of applications. These computing devices require a low power-consuming memory that is capable of operating on a backup battery for extended periods of time. For such devices, a DRAM has typically been employed.

A DRAM contains a memory cell array having a plurality of individual memory cells. Each memory cell is coupled to one of a plurality of bit lines and to one of a plurality of word lines. The memory cells are typically organized in a matrix of rows and columns. Each memory cell in the DRAM usually comprises a single transistor and a single capacitor. With this type of memory cell, a high integration density can be achieved. A data signal written into a memory cell is stored in its associated capacitor. The logic state of the data signal is determined by the charge level of the capacitor.

Figure 1:
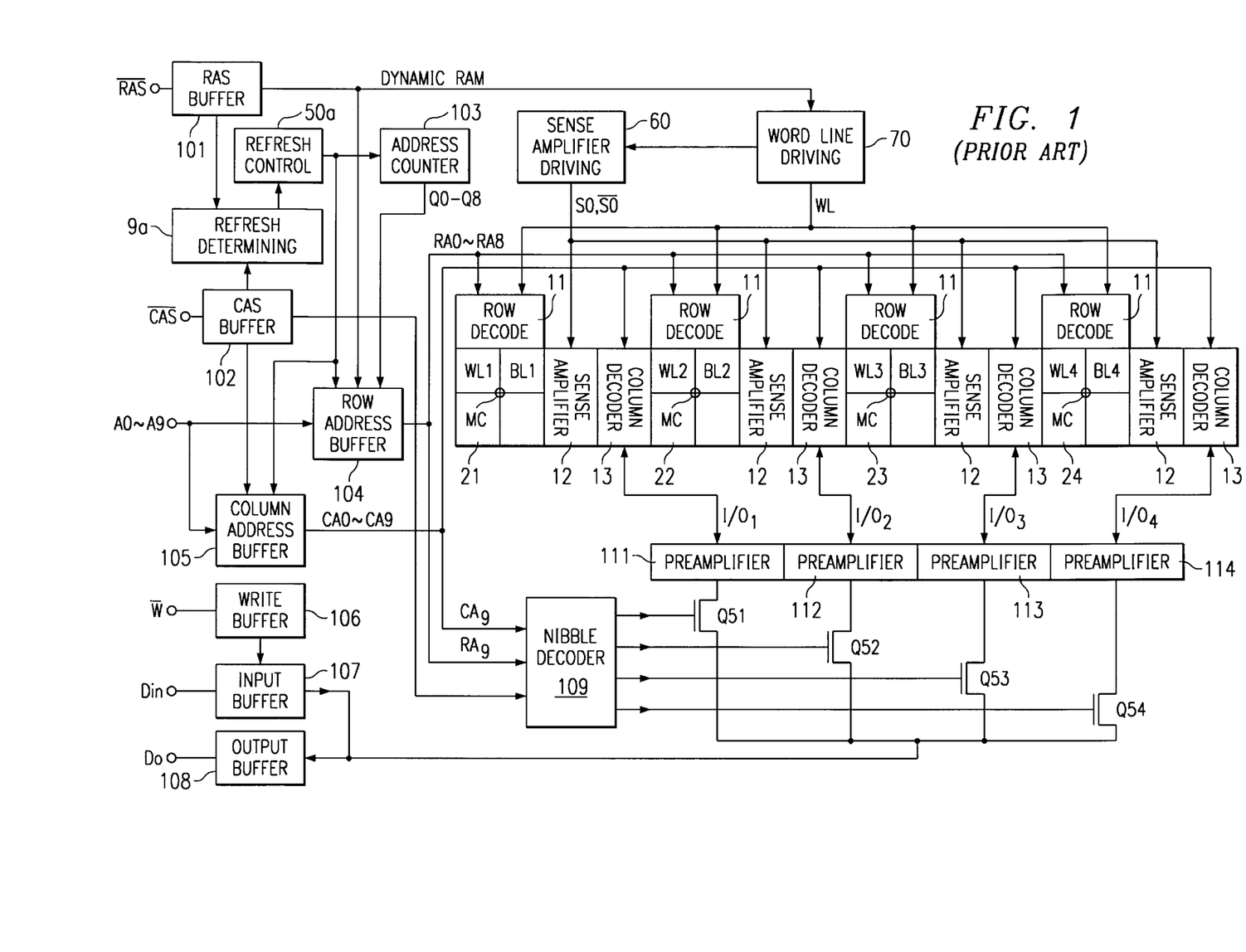
FIG. 1 is a block diagram showing a conventional 1-megabit DRAM macro cell.

FIG. 1 is a block diagram depicting a conventional 1-megabit DRAM macro cell as described in U.S. Pat. No. 4,933,907 to Kumanoya et al. This DRAM comprises memory arrays 21 to 24 with each memory array further comprising a memory cell MC for storing a data signal, row decoders 11, column decoders 13 and sense amplifiers 12. Each of the row decoders 11, each of the column decoders 13, and each of the sense amplifiers 12 is connected to each of the memory arrays 21 to 24 to constitute a separate memory array block. A word line driving circuit 70 is connected to each of the row decoders 11. A sense amplifier driving circuit 60 is connected to each of the sense amplifiers 12. Pre-amplifiers 111 to 114 are used for amplifying the data signals as read out of the memory array blocks. In addition, this DRAM is provided with a RAS buffer 101 receiving an exterior row address strobe (referred to as $\overline{RAS}$ hereinafter) signal, a CAS buffer 102 receiving an exterior column address strobe (referred to as $\overline{CAS}$ hereinafter) signal, a row address buffer 104 for receiving row address signals $RA_0$ to $RA_9$, a column address buffer 105 for receiving exterior column address signals $CA_0$ to $CA_9$, a write buffer 106 receiving an exterior write control signal $\overline{W}$, an input buffer 107 receiving an exterior input data signal $D_{in}$, and an output buffer 108 for temporarily holding an output data signal $D_O$. A refresh determining circuit 9a is provided for determining when a refresh operation should occur based on comparisons between the $\overline{RAS}$ signal in the RAS buffer 101 and the $\overline{CAS}$ signal in CAS buffer 102. The refresh determining circuit 9a has its output connected to a refresh control circuit 50a for controlling a refresh operation. An address counter 103 is provided for generating internal address signals $Q_0$ to $Q_8$ for refreshing.

Operations of the conventional DRAM of FIG. 1 will be briefly described. First, the row and column address signals $RA_0$ to $RA_9$ and $CA_0$ to $CA_9$ are applied to this DRAM as exterior address signals $A_0$ to $A_9$ through an input terminal. Each of the address signals is held in the row address buffer 104 and the column address buffer 103 in response to timings of the falling edges of the $\overline{RAS}$ and $\overline{CAS}$ signals. A word line is then selected in each of the row decoders 11 in response to the row address signals $RA_0$ to $RA_8$. A word line driving signal WL is output to each of the row decoders 11 from the word line driving circuit 70, so that the word line connected to the driving signal WL is activated.

In a read operation, for example, a data signal stored in the memory cell MC of memory array 21 is applied to a bit line BL1. This data signal is amplified by the sense amplifier 12 and then, selected by the column decoder 13, thereby to be applied to a read/write line $I/O_1$. By the foregoing operations, data signals read out from the four memory arrays 21 to 24 are respectively applied to write/read lines $I/O_1$ to $I/O_4$. The pre-amplifiers 111 to 114 further amplify the data signals, respectively.

In a nibble mode, a nibble decoder 109 is operated as a shift register, so that a 4-bit data signal as read out by toggling the $\overline{CAS}$ signal is sequentially transferred to the output buffer 108 through transistors $Q_{51}$ to $Q_{54}$ at high speed. In an ordinary operation (i.e., a read operation or a write operation, excluding the nibble mode), the nibble decoder 109 is operated as a decoder for decoding most significant address signals $RA_9$ and $CA_9$, so that a data signal of one bit out of four bits is transferred to the output buffer 108 through the transistors $Q_{51}$ to $Q_{54}$ in response to the applicable decoded address signals.

In a write operation, for example, the input data signal $D_{in}$ is written into the memory cells MC through the read/write lines $I/O_1$ to $I/O_4$. When a $\overline{CAS}$ signal occurs, the word line WL is still active and the sense amplifier 12 is active. The input data signal must be stronger than that contained in the sense amplifier such as to allow a data signal change on the bit line and thus into the memory cell MC.

Figure 2:
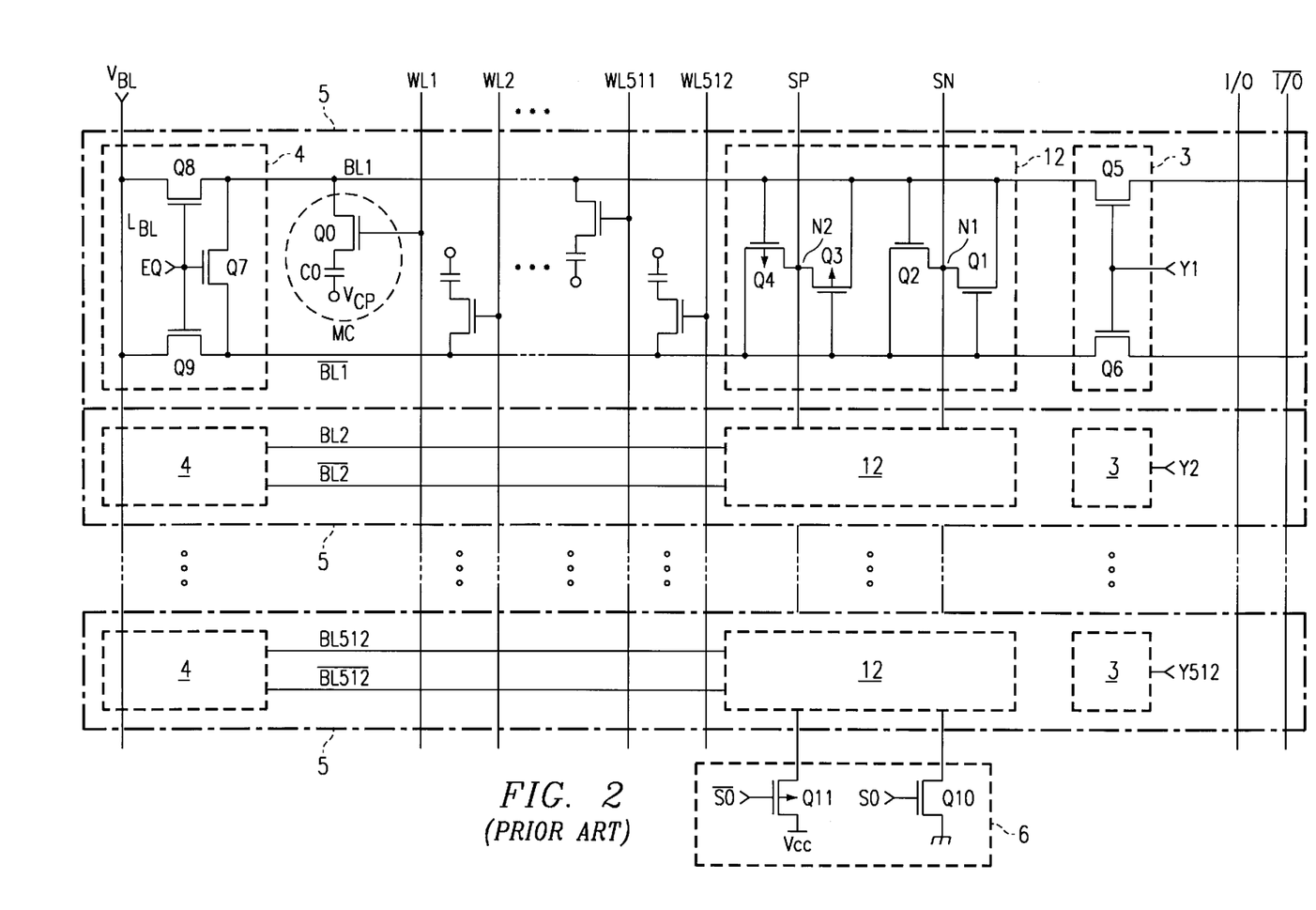
FIG. 2 is a circuit diagram of one of the memory arrays of FIG. 1.
Figure 4:
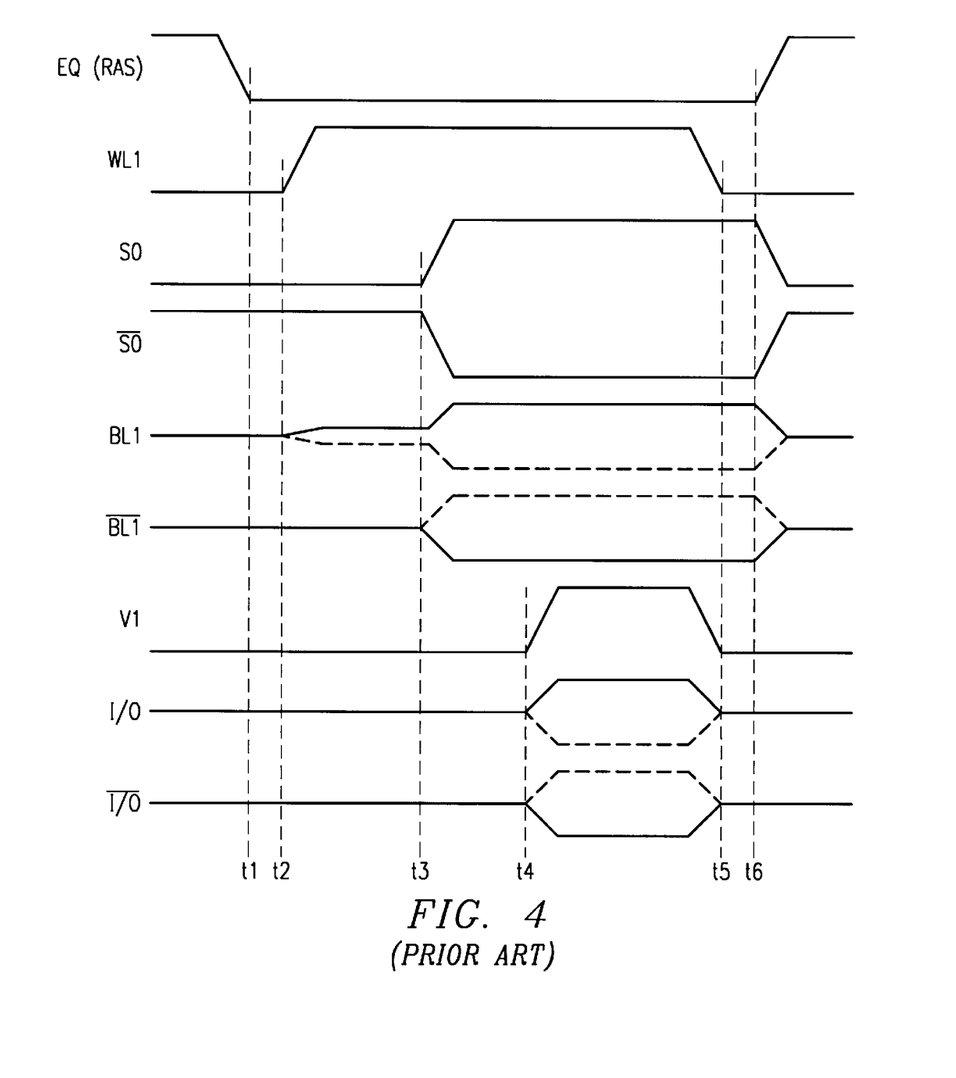
FIG. 4 is a timing diagram describing read and write operations for the DRAM macro cell of FIG. 1.

FIG. 2 is a circuit diagram showing an example of a specific circuit layout of one of the memory arrays 21 to 24 of FIG. 1. FIG. 4 is a timing chart for explaining operation of the DRAM. Referring to FIG. 2, The memory array comprises a memory cell array of columns 5 which can store a 256K-bit data signal. Therefore, 512 word lines WL1 to WL512 are provided and connected and to the associated row decoder 11, and 512 bit line pairs BL1 and $\overline{BL1}$ to BL512 and $\overline{BL512}$ are provided with each bit line pair connected to a sense amplifier 12. In addition, output lines Y1 to Y512 are provided and connected to the associated column decoder 13.

Figure 3:
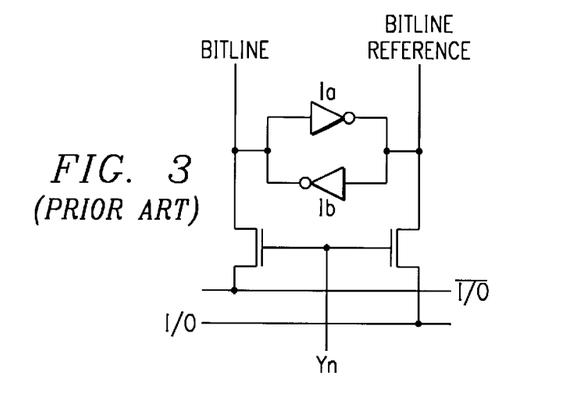
FIG. 3 is a schematic diagram of a conventional refresh amplifier of FIG. 2.

In a column 5 that includes the bit lines BL1 and $\overline{BL1}$, for example, a memory cell MC is connected between the bit line BL1 and the word line WL1. The memory cell MC comprises an NMOS transistor $Q_0$ for switching and a capacitor $C_0$ for storing a data signal. The capacitor $C_0$ has one electrode connected to receive a constant voltage $V_{cp}$ (for example, a voltage of one-half of a power-supply voltage $V_{cc}$) that is externally generated. A column sense amplifier 12 is connected between the bit lines BL1 and $\overline{BL1}$ and formed of two cross-coupled inverters Ia and Ib as symbolically represented in FIG. 3. The column sense amplifier is bidirectional. It refreshes the data signals coming from the associated bit lines to the memory cell in the read operation or the refresh operation and amplifies the data signals coming from a plurality of external unillustrated write drivers during a write operation. There is one sense amplifier per column. They are all used in parallel. As soon as the data signal within a memory cell is refreshed, the column decoder 13 can be activated and transfer the information in one direction or the other. Preferably, the sense amplifier 12 comprises an N channel flip-flop comprising NMOS transistors $Q_1$ and $Q_2$ and a P channel flip-flop comprising PMOS transistors $Q_3$ and $Q_4$ as shown in FIG. 2. The transistors $Q_3$ and $Q_4$ have their sources integrally connected to a common power source line SP, and the transistors $Q_1$ and $Q_2$ have their sources integrally connected to a common power source line SN. An output gating circuit 3 comprises NMOS transistors $Q_5$ and $Q_6$ each connected between the bit lines BL1 and $\overline{BL1}$ and lines I/O and $\overline{I/O}$. The transistors $Q_5$ and $Q_6$ have their gates connected to the output line Y1 of the column decoder. A bit line equalizing and holding circuit 4 is included and comprises NMOS transistors $Q_7$ to $Q_9$ integrally connected to each other such that the gates thereof receive an equalize signal EQ. The bit lines BL1 and $\overline{BL1}$ are connected by line $L_{BL}$ to receive a bit line precharging voltage $V_{BL}$ (½ $V_{cc}$) through circuit 4. When the $\overline{RAS}$ signal is at a high level (in a standby state), the voltage $V_{BL}$ is applied to the bit lines BL1 and $\overline{BL1}$.

In the conventional DRAM, a total of 512 memory cells MC are connected to each bit line pair. In addition, a total of 512 memory cells MC are each connected to either one of the two bit lines of each bit line pair and are further connected to each word line. In this manner, a total of 262,144 1-bit (512×512=256K) memory cells are structured.

In addition, a sense amplifier activating circuit 6 is included and comprises a PMOS transistor $Q_{11}$ connected between a power supply $V_{cc}$ and a common power source line SP and an NMOS transistor $Q_{10}$ connected between ground and a common power source line SN. The transistors $Q_{10}$ and $Q_{11}$ have their gates respectively connected to receive signals $S_0$ and $\overline{S_0}$ from the sense amplifier driving circuit 60.

Referring now to FIGS. 2 and 4, memory operations will be described. First, a precharging operation occurs. The equalize signal EQ is almost synchronized with the external $\overline{RAS}$ signal. This signal EQ is at a high level before a time t1, so that the DRAM is brought to a state in which the RAS signal is at a high level, thereby placing the DRAM in a standby state. In this state, the transistors $Q_7$ to $Q_9$ are turned on, so that all the bit line pairs BL1 to BL512 are brought to ½ $V_{cc}$. This is accomplished by bringing one line of the bit line pair to a power-supply $V_{cc}$ level and the other bit line to a ground level in a previous ordinary operation. The transistor $Q_7$ is then turned on at the time of determination of the cycle, so that the voltage between the bit lines becomes ½ $V_{cc}$. Thus, a voltage of ½ $V_{cc}$ need not be directly supplied from the power supply $V_{BL}$. However, when the standby state lasts for a long time, the voltage $V_{BL}$ is supplied for the purpose of preventing a voltage on the bit line pair from being fluctuated by noise. More specifically, the voltage $V_{BL}$ is applied to the bit line pair through the transistors $Q_8$ and $Q_9$ in order to hold the bit line pair at a $V_{BL}$ level rather than to supply the voltage directly to the bit line pair through $L_{BL}$.

In a reading operation, at about a time $t_1$, the $\overline{RAS}$ signal is changed to a low level, and the signal EQ is also changed to a low level. The transistors $Q_7$ to $Q_9$ are turned off in response to the signal EQ, so that the bit line pair BL1 and $\overline{BL1}$ is rendered electrically floating. At this time, the row address signals $RA_0$ to $RA_9$ are input at the timing of the falling edge of the $\overline{RAS}$ signal. The row decoder decodes the signals $RA_0$ to $RA_8$ to thereby bring one word line out of the 512 word lines WL1 to WL512 into a high level. For example, referring to FIG. 2, the word line WL1 is brought to a high level so that the transistor $Q_0$ is turned on, whereby a data signal stored in the capacitor $C_0$ of the memory cell is applied to a bit line. Since the ratio of a capacitance value of the capacitor $C_0$ in the memory cell to a capacitance value of the bit line BL1 is approximately 1:10, the change in voltage of approximately one-tenth of the power-supply voltage $V_{cc}$ appears on the bit line. Thus, a voltage on the bit line BL1 is slightly raised. On the other hand, a voltage of the bit line $\overline{BL1}$ remains at ½ $V_{cc}$.

At a time $t_3$, the sense amplifier driving signals $S_0$ and $\overline{S_0}$ are respectively changed to a high level and a low level. The transistors $Q_{10}$ and $Q_{11}$ are turned on in response to the signals, so that the 512 sense amplifiers 12 are driven. Thus, for example, a very small change in voltage which appears between the bit lines BL1 and $\overline{BL1}$ is amplified, so that the bit line BL1 is brought to a high level while the bit line $\overline{BL1}$ is brought to a low level. At this time point, voltages of the 512 bit line pairs are changed by the 512 associated sense amplifiers in response to the data signals stored in the 512 associated memory cells.

At a time $t_4$, an output signal (for example, a high level signal Y1) for selecting one of the 512 bit line pairs is output from the column decoder 13. The transistors $Q_5$ and $Q_6$ are turned on in response to the signal Y1, so that the amplified data signal is applied to the read/write line pair I/O and $\overline{I/O}$. This read/write line pair has been brought to a floating state in advance, the level thereof being changed depending on the level of the signal from the bit line pair.

At a time $t_5$, a voltage of the word line WL1 is changed to a low level, so that each of the memory cells connected to this word line WL1 and each of the bit lines are electrically disconnected. In addition, at a time $t_6$, the sense amplifier driving signals $S_0$ and $\overline{S_0}$ are respectively changed to a low level and a high level, and the equalize control signal EQ (and the $\overline{RAS}$ signal) is changed to a high level. Consequently, all the bit line pairs are brought to a ½ $V_{cc}$ level, so that the DRAM is brought to a standby state in preparation for the next cycle. Thus, one read operation has been completed.

Meanwhile, the level of voltages of the bit lines amplified in a period from the time $t_3$ to time $t_5$ is rewritten to all the memory cells connected to the word line WL1. The change in voltage represented by a dotted line in FIG. 4 corresponds to a case in which a data signal of a level opposite to that in the above described case is stored in a memory cell.

In a writing operation, the read/write line pair I/O and $\overline{I/O}$ is brought to the level of a data signal to be written in response to the input data signal as input to the input buffer 107. This data signal is applied to a bit line pair selected by the column decoder after the time $t_4$, to be stored in a memory cell connected to a word line which was brought to a high level.

As previously described, a memory cell of a DRAM device comprises a single transistor and a single capacitor, as described above. Thus, if the DRAM continues to be held in a standby state for a long time, charges stored in the capacitor are gradually lost by junction leak or current leakages from the capacitors and transistors. Moreover, when an given memory cell is accessed, its charge content can be significantly modified by a charge sharing that occurs between its capacitor and associated bit line. Therefore, the stored data signals must be read out every given constant time period, to be rewritten and thereby restore their original charge levels. This procedure is referred to as a refresh operation.

A refresh operation generally can be accomplished in two ways. First, in a $\overline{RAS}$ only refresh mode, the $\overline{RAS}$ signal and the row address signal are applied from an exterior source to perform the refresh operation. Second, in a $\overline{CAS}$ before $\overline{RAS}$ (auto) refresh operation, only $\overline{RAS}$ and $\overline{CAS}$ signals are applied from an exterior source, so that the refresh operation is performed using a refresh control signal output from an address counter 103 as an interior source. These refresh modes are typically referred to as ordinary refresh modes.

The $\overline{CAS}$ before $\overline{RAS}$ refresh operation for the conventional DRAM will now be described. When an ordinary reading or writing operation is initiated, the $\overline{RAS}$ signal is first lowered and then the $\overline{CAS}$ signal is lowered. However, when the $\overline{CAS}$ signal is lowered prior to the $\overline{RAS}$ signal, the $\overline{CAS}$ before $\overline{RAS}$ refresh mode is initiated. In order to detect timings at which the RAS and $\overline{CAS}$ signals are changed, a refresh determining circuit 9a is provided shown in FIG. 1. When designation of the $\overline{CAS}$ before $\overline{RAS}$ refresh mode is detected by the circuit 9a, the refresh control circuit 50a initiates operation of the address counter 103. In response to a control signal from the control circuit 50a, the row address buffer 104 receives the signals $Q_0$ to $Q_8$ output from the address counter 103 in place of the address signals $A_0$ to $A_9$ as externally applied. The row address signals $RA_0$ to $RA_8$ for refreshing are output from the row address buffer 104. The subsequent refresh operations are almost the same as the above described reading operation except that a data signal read out of a memory cell to a bit line pair is not applied to a read/write line pair I/O and $\overline{I/O}$.

More specifically, referring to FIG. 2, one of the 512 word lines is selected, so that the 512 memory cells are connected to the 512 bit line pairs. Data signals applied to each of the bit line pairs from each of the memory cells are amplified by the 512 sense amplifiers 12 and then, rewritten into each of the memory cells of a row. A single refresh period is defined as the period of time it takes for a row of memory cells of the memory cell array to be refreshed (with all the memory cells on the row being refreshed at the same time). In one memory refresh period, the 512 memory cells are refreshed. In such a refresh operation, the data signal as read out need not be output, so that the column address signal need not be applied.

Such a $\overline{CAS}$ before $\overline{RAS}$ refresh operation using the $\overline{RAS}$ and $\overline{CAS}$ signals is repeated 512 times, so that the address counter 103 is incremented 512 times. Thus, the 512 word lines (WL1 to WL512 shown in FIG. 2) are sequentially activated, so that all 256K-bit memory cells are refreshed. In this example, the 1024K 1-bit memory cells of the four memory arrays 21 to 24 are all refreshed. The amount of time it takes to refresh all of the rows of the memory cell arrays (with read and write operations also occurring within this cycle) is called the refresh cycle time.

A refresh operation is very similar to the read operation, with the only difference being that the data does not go onto the output lines in this case. In the DRAM shown in FIG. 1, the four memory cell arrays 21 to 24 are simultaneously refreshed in the ordinary refresh operation. More specifically, the four row decoders 11 receive the word line driving signal WL, to simultaneously select sequentially the word lines in the memory arrays 21 to 24. At the same time, the sense amplifier in each of the memory cell arrays 21 to 24 is driven by the sense amplifier driving signal $S_0$. The refresh operation should be performed each time a memory cell is read. The refresh operation need not be performed when a memory cell is written since new data is being forced into its associated capacitor. Even without a read or write access, the memory cell must be periodically refreshed to compensate for current leakages.

The average period of time required to perform a refresh operation—the average refresh period—is a very important design and operational parameter. The average delay between two refresh operations or cycles is the refresh cycle time divided by the number of rows of the memory array. For example, for a typical 1-megabit embedded DRAM with 1024 rows of memory cells, the refresh cycle time is typically about 4 ms. This 1-megabit DRAM must refresh one row every 4 $\mu$s on average and is not available for read and write operations for approximately 60 ns. Thus, for this DRAM the refresh cycle interrupts the normal or ordinary operations for about 1.5% (60 ns/4 $\mu$s*100) of the total available time. In order to manage operational and refresh time, an external computer or an on-board timer must be added, thereby increasing costs reflected in the loss of operating cycles or in an increase in semiconductor area. For example, in order to perform the refresh operation for a conventional DRAM device, a circuit must be provided for controlling timings of the $\overline{RAS}$ and $\overline{CAS}$ signals. Consequently, the size of the equipment becomes larger and power consumption is increased. Furthermore, the problem of loss of operational time becomes much more serious as the size of the memory cell increases. Furthermore, a 2-megabit DRAM refresh cycle can use 3% of the time, a 4-megabit DRAM 6%, and so forth. Generally, the refresh cycle time and the average refresh period increase by two times when the storage capacity increases by four times.

There appear to be only two possible ways to reduce the inherent limitation of unavailable time on the DRAM. First, one may try to increase the refresh period. This is relatively easy to accomplish for a stand-alone DRAM, because the stand alone DRAM uses a dedicated process and hardware that is fully adapted to solve this particular problem. Typical refresh periods of 128 milliseconds and over can be observed on these devices. Second, one may employ a self-refresh state machine on the DRAM that is able to perform several functions. First, at a high level, the self-refresh state machine can manage the refresh operation by itself without assistance of an external central processing unit (CPU). Consequently, the self-refresh state machine may be embedded directly on the DRAM macro cell itself, thereby allowing the DRAM to be readily used on different computer architectures. For example, the DRAM macro cell may be itself embedded onto many different CPUs, each working with a different set of instructions. Furthermore, system designers will find the use of the self-refresh state machine more advantageous in computer system design, because it is more desirable for the memory itself to request a CPU interrupt when a memory refresh is needed rather than for the system designer to be required to create a process or application to manage memory refresh based on the specific computer architecture. Second, at a lower level, the self-refresh state machine can be used to hide refresh cycles during normal accesses when some of the DRAM resources are not being used. This is especially evident during $\overline{CAS}$ accesses, where all the row sensing operations are static and could be reactivated to perform refresh cycles on a used part of the memory.

Various methods have been proposed to address the problems of increasing power consumption and loss of operational time with respect to DRAM operations. For example, U.S. Pat. No. 4,961,167 to Kumanoya discloses a substrate bias generator in a DRAM with auto/self refresh functions, U.S. Pat. No. 5,418,920 discloses a refresh control method and system including request and refresh counters and priority arbitration circuitry, U.S. Pat. No. 5,430,680 to Parris discloses a DRAM having self-timed burst refresh mode, and U.S. Pat. No. 5,629,898 to Idei et. al discloses a dynamic memory device with a memory module and a method of refreshing a dynamic memory device. However, these devices require the use of complex circuitry—thereby requiring more power and area—and do not implement the desired self-refresh state machine approach to accomplish DRAM macro cell refresh operations for increasing the amount of operational time.

SUMMARY OF THE INVENTION

The present invention implements a new refresh scheme interface architecture for an embedded DRAM circuit. The present invention substantially departs from the described prior art and conventional methods by providing a DRAM with circuitry whose purpose is to essentially hide refresh operations during normal memory accesses, thus optimizing the availability of the DRAM on application.

The present invention allows refresh operations to occur without the use of an external timer, thereby decreasing the overall size of the DRAM macro cell.

The present invention allows increased flexibility in controlling the sequencing of refresh operations on the DRAM macro cell.

The present invention may be emplaced to work in conjunction with different computing architectures on a variety of electronic devices without the need for designing ancillary circuitry for managing architecture-specific refresh functionality as was required for prior art DRAM devices.

The present invention allows refresh cycles to be interspersed during ordinary DRAM read and write operations, thereby allowing the execution of DRAM refresh operations without causing an appreciable time penalty. Consequently, the refresh operation of the present invention is, in effect, hidden.

The present invention does not require fixed wiring with a central processing unit of an external computer. Thus, the present invention can be used in a variety conventional computer memory applications or products.

Briefly stated, the present invention essentially comprises a plurality of memory cells for storing data signals. A row decoding mechanism is included for allowing selected memory cells to be accessed upon receipt of a row address during a read operation and a write operation. A latching mechanism is provided and receives and holds onto the data signals from the selected memory cells when it is activated during the read operation. The latching mechanism also has a deactivated mode for isolating it from the selected memory cells. Furthermore, a refresh address generating mechanism is provided for generating an internal row address to allow selection of a plurality of memory cells for refreshing the data signals stored therein. Lastly, a multiplexer mechanism is included for transmitting an external row address to the row decoding means in the write operation. The multiplexer mechanism is also used for transmitting the internal row address from the refresh address generating means in the read operation to cause the row decoding mechanism to apply the internal row address to select memory cells and thus allow the data signals stored therein to be refreshed.

In a preferred embodiment, the present invention includes a plurality of memory arrays. Each memory array comprises a plurality of memory cells for storing data signals. Each memory array has a plurality of word lines and at least one pair of complementary bit lines. Each word line and each bit line is coupled to one of the memory cells to allow selection thereof for reading a data signal therefrom during a read operation and writing a data signal thereto during a write operation. Each memory array has at least one bit line equalizing circuit coupled between the bit lines. The bit line equalizing circuit is used for placing the bit lines at an equalized potential when these bit lines are selected during the read operation. Each of the memory arrays has at least one sense amplifier coupled between the bit lines. The sense amplifier is activated during the read operation for differentially sensing and amplifying the potential difference on the selected bit lines due to the potential of the data signal stored in the associated memory cell. This sensing operation occurs when one of the word lines is selected. Each of the memory arrays also has at least one latch coupled between the bit lines and to the sense amplifier. The latch is used for receiving and holding the data signals output from the sense amplifier during the read operation. A latch gating circuit is used to control the operation of each latch. The latch gating circuit is coupled between the bit lines and between the sense amplifier and the latch. The latch gating circuit has an enabled mode for allowing the data signals from the sense amplifier to be loaded into the latch during the read operation. The latch gating circuit also has a disabled mode for allowing the sense amplifier to be isolated from the latch during the write operation. Lastly, each of the memory arrays includes at least one output gating circuit. The output gating circuit is coupled between the bit lines and to the sense amplifier and allows the data signals to be read in the read operation and the data signals to written to selected memory cells in the write operation.

In addition, a row decoder is provided. The row decoder is coupled to the word lines of each of the memory arrays. The row decoder allows selected memory cells to be accessed upon receipt of a row address during the read operation and the write operation.

A refresh address generator is included. The refresh address generator is used for generating an internal row address. This row address allows selection of a plurality of memory cells for refreshing their associated stored data signals.

Lastly, a multiplexer is provided and has an input that is coupled to the refresh address generator for receiving the internally-generated row address. Another input of the multiplexer is used for receiving an externally-generated row address. The multiplexer has an output for transmitting the external row address to the row decoder in the write operation and for transmitting the internal row address from the refresh address generator in the read operation. When the internal row address is transmitted to the row decoders, the row decoders use it to select memory cells, thereby allowing the data signals stored therein to be refreshed.

DESCRIPTION OF THE PREFERRED EMBODIMENT

Figure 5:
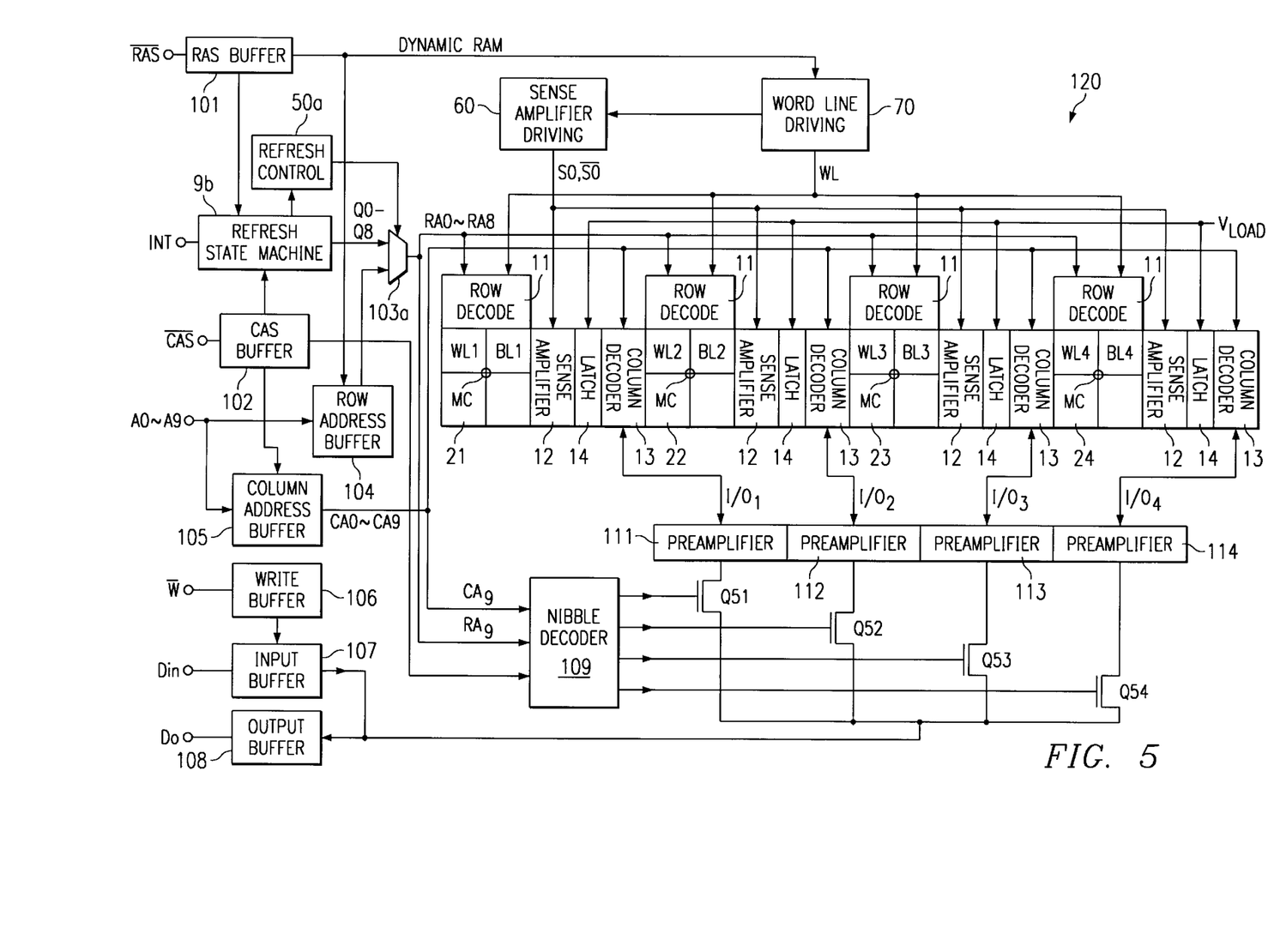
FIG. 5 is a block diagram of showing a 1-megabit DRAM according to one embodiment of the present invention.

The the present invention is shown in the block diagram of FIG. 5 and is designated by reference number 120. The present invention is shown implemented as a 1-megabit DRAM macro cell but can be readily scaled to larger or smaller memory sizes. Principal differences between the present invention and a conventional DRAM and can be made by comparing FIG. 5 with FIG. 1. Referring to FIG. 5, the present invention includes latches 14 that are placed between the column sense amplifiers 12 and the column decoders 13. In addition, the present invention includes a multiplexer 103a that is used in lieu of the address counter 103 of FIG. 1 and a refresh state machine 9b that is used in lieu of refresh determining circuit 9a.

Figure 6:
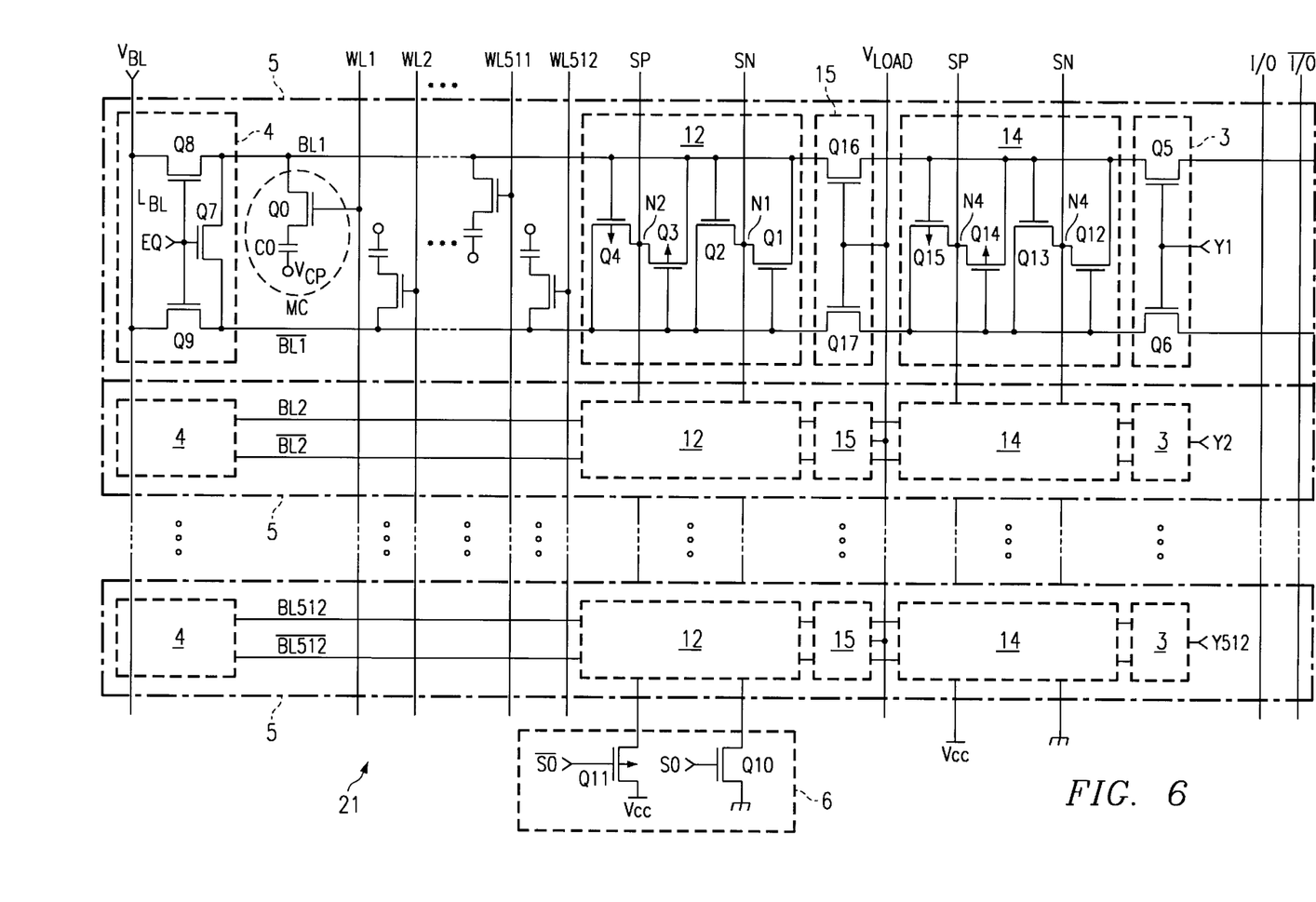
FIG. 6 is a circuit diagram of one of the memory arrays of FIG. 5.
Figure 7:
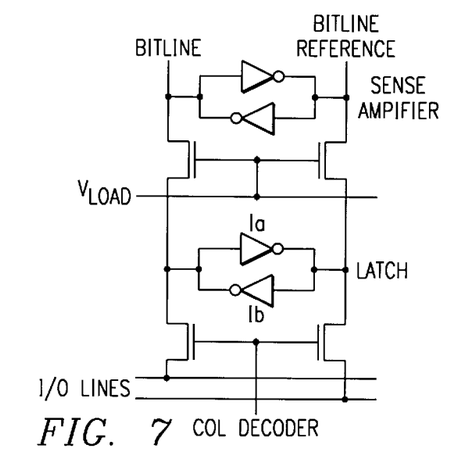
FIG. 7 is a schematic diagram of a refresh amplifier and associated latch of the present invention.

More specifically, referring to a single column 5 of the memory array 21 of FIG. 6, a latch 14 is coupled between the associated complementary bit lines BL1 and $\overline{BL1}$. Latch 14 is placed after sense amplifier 12 and is used for receiving and holding the data signals output from the sense amplifier during the read operation. As shown in FIG. 7, the sense amplifier 12 is formed of two cross-coupled inverters Ic and Id. Preferably, each latch 14 comprises an N channel flip-flop comprising NMOS transistors $Q_{12}$ and $Q_{13}$ and a P channel flip-flop comprising PMOS transistors $Q_{14}$ and $Q_{15}$. The transistors $Q_{14}$ and $Q_{15}$ have their sources integrally connected to a common power source line SP, and the transistors $Q_{12}$ and $Q_{13}$ have their sources integrally connected to a common power source line SN.

Furthermore, referring to FIG. 6, a latch gating circuit 15 is included and connected between the bit lines lines BL1 and $\overline{BL1}$. The latch gating circuit 15 comprises NMOS transistors $Q_{16}$ and $Q_{17}$. The gating circuit is connected between the bit lines BL1 and $\overline{BL1}$ between sense amplifier 12 and latch 14. The transistors $Q_{16}$ and $Q_{17}$ have their gates commonly connected to the control line $V_{LOAD}$ for receiving an external latch control signal. Through external control of the $V_{LOAD}$ signal, the latch 14 has an enabled or activated mode for allowing data signals from the sense amplifier 12 to be loaded into the latch during the read operation and a disabled or deactivated mode for allowing the sense amplifier to be isolated from the latch during the write operation. If the transistors $Q_{16}$ and $Q_{17}$ are peak channel pass devices, the zero level won't be fully transferred between the latch 14 and the associated sense amplifier 2. However, this is a very useful consequence since the bit lines must be kept at a voltage of approximately 0.35 volts to minimize transistor leakages into the memory cell.

Referring again to FIG. 5, a refresh address generating mechanism such as a refresh state machine 9b is provided and used for generating internal row address signals $Q_0$ to $Q_8$ for refreshing the data signals stored in the memory cells. The internal row address signals provided by the refresh state machine are independent to the memory architecture. The only requirement that need be met is that the refresh state machine 9b provide all the row addresses to the row decoder 11 during one refresh period. The order of receipt of the row addresses is not significant—an incremental, decremental, or pseudo-random pattern can be used. However, the recommended pattern to use is that defined for a memory test, because the refresh state machine can be structured as a subset of a conventional BIST state machine. Besides generating the row pattern for refreshing, the refresh state machine can possibly generate an interim signal as an interrupt to the CPU for control or diagnostic purposes.

Figure 9:
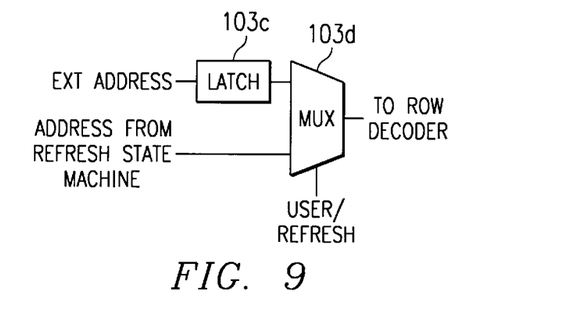
FIG. 9 is a schematic diagram of the multiplexer mechanism of the present invention that allows management of read, write, and refresh operations of the present invention.

Lastly, a multiplexer mechanism 103a is provided. The multiplexer mechanism has a first input connected to the refresh state machine 9b for receiving the internal row address signals $Q_0$ to $Q_8$. A second input is connected to the row address buffer for receiving the external row address signals $RA_0$–$RA_8$ as provided via $A_0$–$A_9$. The multiplexer mechanism has a third input that is coupled to the refresh control mechanism 50a and controls whether the first or the second input is selected for output to the row decoders 11. In operation, the multiplexer mechanism transmits an external row address to the row decoding means in the write operation. In the read operation, the multiplexer mechanism transmits the internal row address from the refresh state machine 9b, thus causing the row decoders 11 to apply the internal row address signals to the memory arrays 21 to 24 to select memory cells and allow the stored data signals to be refreshed. As shown FIG. 9, the multiplexer mechanism can be implemented using a conventional multiplexer 103d, and the row address buffer 104 can be implemented with a conventional latch 103c. Latch 103c is used in the write operation to amplify the external data address signal from an unillustrated external write driver and thus facilitate switching of the sense amplifier.

Figure 8A:
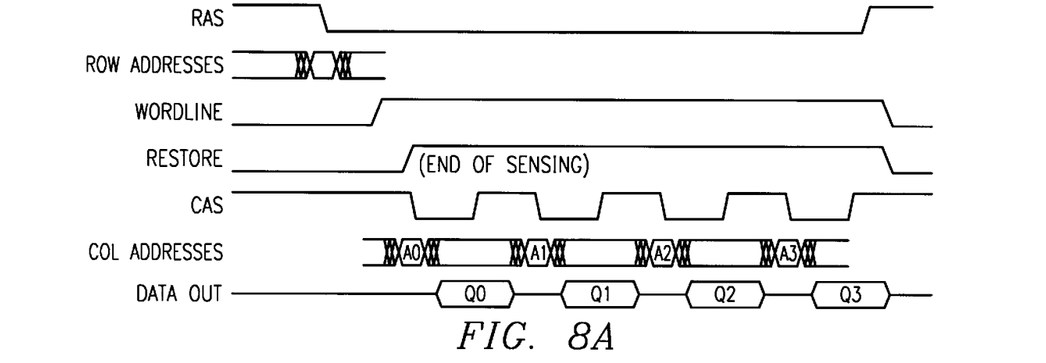
FIG. 8A is a timing diagram describing read and write operations for the conventional DRAM macro cell of FIG. 1.
Figure 8B:
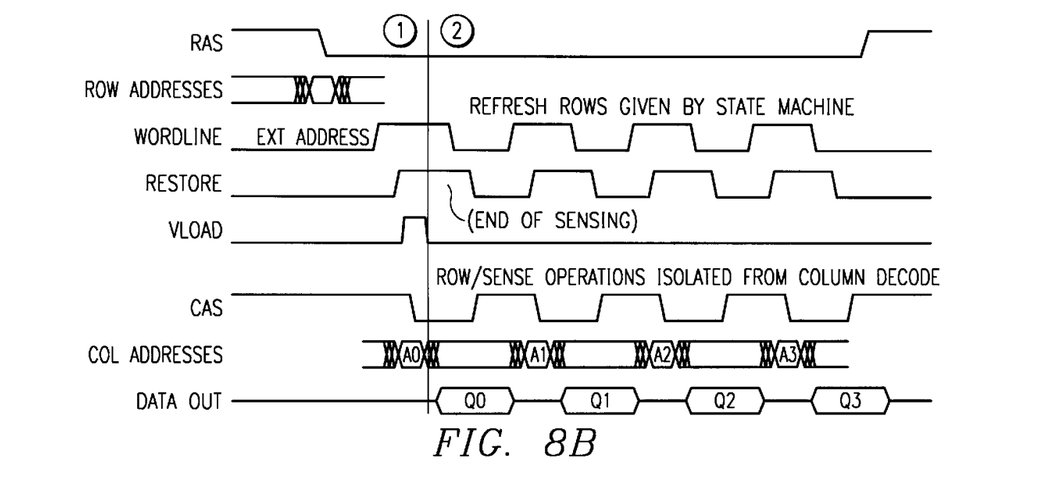
FIG. 8B is a timing diagram describing the read and write operations for the DRAM macro cell of FIG. 5.

The primary differences between the timing diagrams of a conventional DRAM and that of the present invention during the read operation can be made by comparing FIG. 8A with FIG. 8B. In Phase 1 of FIG. 8B (the first read operation), the present invention functions in exactly in the same manner as the conventional DRAM as previously described. Latch 14 is initially transparent to the read and write operations. At the rising edge of the $V_{LOAD}$ signal, the data signals are downloaded into the latch 14 from the column sense amplifier 12. At the falling edge of $V_{LOAD}$, the transistors $Q_{16}$ and $Q_{17}$ of the latch gating circuit 15 are turned off, and the latch 14 and the sense amplifier 12 are thus isolated from each other. Subsequent column accesses that occur will read a copy of the data signal that is stored in the latch 14. Now, Phase 2 starts when the refresh state machine 9b begins operating. Row address signals previously available at the row decoders 11 are replaced by internal row address signals as generated by the refresh state machine. The external row address signals remain in the row address buffer 104 in case of a write operation. The refresh state machine thus provides the different row address signals that synchronize row accesses for refresh operations. The sense amplifiers continue to work in a slave mode to the row read operations, and therefore all pre-charge, sensing and refresh operations occur without any special control.

During a write access, the real address must be present in the row decoder 11 to allow the storage of a new data signal into the designated memory cell. For this reason, the refresh state machine is put on hold during the write operation and does not operate. In case of an absolute request for a refresh (i.e., a timeout), the refresh state machine can send an interrupt request INT to the external CPU indicating that memory is not available, thus preventing a write operation from occurring.

Generally, the number of write operations is far smaller than the number of read operations. Typically, they differ by a factor a of 5 to 10. Therefore, the number of read operations should be sufficient in most cases to completely hide the refresh operations.

What is claimed is:

1. A dynamic access memory device comprising:

a plurality of memory cells for storing data signals;

row decoding means for allowing selected memory cells to be accessed upon receipt of a row address signal during a read operation and a write operation;

latching means for receiving and holding onto the data signals from the selected memory cells when activated during the read operation and for isolating itself from the selected memory cells when deactivated during the write operation;

refresh address generating means for generating a plurality of internal row address signals to allow selection of a plurality of memory cells for refreshing the data signals stored therein; and multiplexer means for transmitting a plurality of external row address signals to the row decoding means in the write operation and for transmitting the internal row address signals from the refresh address generating means in the read operation to cause the row decoding means to apply the internal row address signals to select memory cells and allow the data signals stored therein to be refreshed.

2. The dynamic access memory device as set forth in claim 1 wherein the latching means comprises a plurality of latches for receiving and holding the data signals.

3. The dynamic access memory device as set forth in claim 1 wherein the latching means comprises:

a plurality of latches for receiving and holding the data signals; and a plurality of latch gating circuits each coupled one of the latches and each having an enabled mode for allowing the data signals to be loaded into the associated latch during the read operation and a disabled mode for allowing the associated latch to be isolated during the write operation.

4. The dynamic access memory device as set forth in claim 1 wherein the latching means comprises a plurality of latches each formed of two cross-coupled inverters.

5. The dynamic access memory device as set forth in claim 1 wherein the latching means comprises a plurality of latches each formed of an N channel flip-flop and a P channel flip-flop.

6. The dynamic access memory device as set forth in claim 1 wherein the memory cells are arranged in a plurality of memory arrays with the memory cells of each memory array further arranged in a matrix.

7. The dynamic access memory device as set forth in claim 1 wherein the memory cells are arranged in a plurality of memory arrays with each of the memory arrays having a plurality of word lines and a pair of complementary bit lines with each word line and each bit line coupled to one of the memory cells to allow selection thereof for reading a data signal therefrom during a read operation and writing a data signal thereto during a write operation.

8. The dynamic access memory device as set forth in claim 1:

wherein the memory cells are arranged in a plurality of memory arrays with each of the memory arrays having a plurality of word lines and a pair of complementary bit lines with each word line and each bit line coupled to one of the memory cells to allow selection thereof for reading a data signal therefrom during a read operation and writing a data signal thereto during a write operation;

and further comprising a bit line equalizing circuit coupled between the bit lines for placing the bit lines at an equalized potential when the bit lines are selected during the read operation.

9. The dynamic access memory device as set forth in claim 1:

wherein the memory cells are arranged in a plurality of memory arrays with each of the memory arrays having a plurality of word lines and a pair of complementary bit lines with each word line and each bit line coupled to one of the memory cells to allow selection thereof for reading a data signal therefrom during a read operation and writing a data signal thereto during a write operation;

and further comprising a sense amplifier coupled between the bit lines and activated during the read operation for differentially sensing and amplifying a potential difference on the selected bit lines due to the data signals stored in the associated memory cells when one of the word lines is selected.

10. The dynamic access memory device as set forth in claim 1 wherein multiplexer means comprises a multiplexer with a latch coupled to an input thereof.

11. A dynamic access memory device comprising:

a plurality of memory arrays each comprising a plurality of memory cells for storing data signals;

each of the memory arrays having a plurality of word lines and a pair of complementary bit lines with each word line and each bit line coupled to one of the memory cells to allow selection thereof for reading a data signal therefrom during a read operation and writing a data signal thereto during a write operation;

each of the memory arrays having a bit line equalizing circuit coupled between the bit lines for placing the bit lines at an equalized potential when the bit lines are selected during the read operation;

each of the memory arrays having a sense amplifier coupled between the bit lines and activated during the read operation for differentially sensing and amplifying a potential difference on the selected bit lines due to the data signal stored in the associated memory cells when one of the word lines is selected;

each of the memory arrays having a latch coupled between the bit lines for receiving and holding the data signals output from the sense amplifier during the read operation;

a row decoder coupled to the word lines of each of the memory arrays for allowing selected memory cells to be accessed upon receipt of a row address signal during the read operation and the write operation;

a refresh address generator for generating an internal row address signals to allow selection of a plurality of memory cells in non sequential order for refreshing the data signals stored therein; and a multiplexer coupled to refresh address generator for transmitting an external row address signals to the row decoder in the write operation and for transmitting the internal row address signals from the refresh address generator in the read operation to cause the row decoders to apply the internal row address signals to select memory cells and allow the data signals stored therein to be refreshed.

12. The dynamic access memory device as set forth in claim 11 and further comprising a column decoder coupled to the bit lines of each of the memory arrays for allowing selected memory cells to be accessed upon receipt of an external column address signal during the read operation and the write operation.

13. The dynamic access memory device as set forth in claim 11 and further comprising:
   a column decoder coupled to the bit lines of each of the memory arrays for allowing selected memory cells to be accessed upon receipt of an external column address signal during the read operation and the write operation; and
   an output gating circuit formed of a pair of MOS transistors each separately coupled to one of the bit lines and both having their gates commonly coupled to the column decoder.

14. The dynamic access memory device as set forth in claim 11 wherein the latch of each memory array comprises a pair of MOS transistors each separately coupled to one of the bit lines and both having their gates commonly coupled for receiving an external control signal.

15. The dynamic access memory device as set forth in claim 11 wherein the bit line equalizing circuit of each memory array comprises a first, a second, and a third MOS transistor with the first and the second transistor each separately coupled to one of the bit lines, the third transistor coupled between the bit lines, and with each of the transistors having their gates commonly coupled to a node for receiving a control signal.

16. A dynamic access memory device with a plurality of memory arrays each comprising:
   a plurality of memory cells each for storing a data signals at a given potential;
   a plurality of word lines and a pair of complementary bit lines with each word line and each bit line coupled to one of the memory cells to allow selection thereof for reading a data signal therefrom during a read operation and writing a data signal thereto during a write operation;
   a bit line equalizing circuit coupled between the bit lines for placing the bit lines at an equalized potential when the bit lines are selected during the read operation;
   a sense amplifier coupled between the bit lines and activated during the read operation for differentially sensing and amplifying a potential difference on the selected bit lines due to the data signals stored in the associated memory cells when one of the word lines is selected;
   a latch coupled between the bit lines for receiving and holding the data signals output from the sense amplifier during the read operation; and
   a latch gating circuit coupled between the bit lines and between the sense amplifier and the latch and having an enabled mode for allowing the data signals from the sense amplifier to be loaded into the latch during the read operation and a disabled mode for allowing the sense amplifier to be isolated from the latch during the write operation
   a refresh state machine for supplying addresses of memory cells to be refreshed, the state machine for providing addressing patterns such that inactive portions of the plurality of memory cells can be refreshed when the memory cells are inactive.

17. The dynamic access memory device as set forth in claim 16 and further comprising a column decoder coupled to the bit lines for allowing selected memory cells to be accessed upon receipt of an external column address signal during the read operation and the write operation.

18. The dynamic access memory device as set forth in claim 16 and further comprising:
   a column decoder coupled to the bit lines for allowing selected memory cells to be accessed upon receipt of an external column address signal during the read operation and the write operation; and
   an output gating circuit formed of a pair of MOS transistors each separately coupled to one of the bit lines and both having their gates commonly coupled to the column decoder.

19. The dynamic access memory device as set forth in claim 16 wherein the latch gating circuit comprises a pair of MOS transistors each separately coupled to one of the bit lines and both having their gates commonly coupled for receiving an external control signal.

20. The dynamic access memory device as set forth in claim 16 wherein the bit line equalizing circuit comprises a first, a second, and a third MOS transistor with the first and the second transistor each separately coupled to one of the bit lines, the third transistor coupled between the bit lines, and with each of the transistors having having their gates commonly coupled to a node for receiving a control signal.

* * * * *